(12) United States Patent
Monden et al.

(10) Patent No.: US 12,729,433 B2
(45) Date of Patent: Sep. 8, 2026

(54) PRECOAT METHOD FOR SUBSTRATE PROCESSING APPARATUS AND SUBSTRATE PROCESSING APPARATUS

(71) Applicant: Tokyo Electron Limited, Tokyo (JP)

(72) Inventors: Taichi Monden, Yamanashi (JP); Atsushi Tanaka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 56 days.

(21) Appl. No.: 18/522,825

(22) Filed: Nov. 29, 2023

(65) Prior Publication Data

US 2024/0191349 A1 Jun. 13, 2024

(30) Foreign Application Priority Data

Dec. 12, 2022 (JP) ................................ 2022-198124

(51) Int. Cl.

*C23C 16/44* (2006.01)
*C23C 16/34* (2006.01)
*C23C 16/455* (2006.01)
*C23C 16/52* (2006.01)

(52) U.S. Cl.

CPC .......... *C23C 16/4405* (2013.01); *C23C 16/34* (2013.01); *C23C 16/4408* (2013.01); *C23C 16/45527* (2013.01); *C23C 16/45544* (2013.01); *C23C 16/52* (2013.01)

(58) Field of Classification Search

None
See application file for complete search history.

(56) References Cited

U.S. PATENT DOCUMENTS 9,472,398 B2 * 10/2016 Saito ........................ C23C 16/34
2005/0039680 A1 * 2/2005 Beaman .............. C23C 16/4404 427/248.1
2014/0295083 A1 10/2014 Nasu et al.
2014/0326276 A1 * 11/2014 Wu .................. H01J 37/32862 134/1.1
2017/0250086 A1 * 8/2017 Urano ..................... H10P 14/43
2020/0258748 A1 * 8/2020 Okada ..................... C23C 16/34
2021/0115560 A1 * 4/2021 Yamaguchi ....... H01L 23/53266

FOREIGN PATENT DOCUMENTS

EP 0416400 A1 * 3/1991 ....... H01L 21/67028
JP 2003-051533 2/2003
JP 2004-288903 10/2004
JP 2010-034362 2/2010
JP 2017-098543 6/2017
KR 20200035210 * 4/2020
WO WO-2009134925 A2 * 11/2009 ......... H10D 30/0212

* cited by examiner

*Primary Examiner* — Mandy C Louie
(74) *Attorney, Agent, or Firm* — IPUSA, PLLC

(57) ABSTRACT

A precoat method for a substrate processing apparatus for depositing on a substrate using a raw material gas and a reducing gas is provided. The method includes: a) supplying a fluorine-containing gas into a processing chamber to clean an inside of the processing chamber; b) after a), supplying a reducing gas into the processing chamber to purge the inside of the processing chamber; c) after b), supplying a raw material gas and a reducing gas into the processing chamber to form a precoat film; and d) after c), supplying a reducing gas into the processing chamber to purge the inside of the processing chamber before depositing on a subsequent substrate.

5 Claims, 9 Drawing Sheets

FIG.4

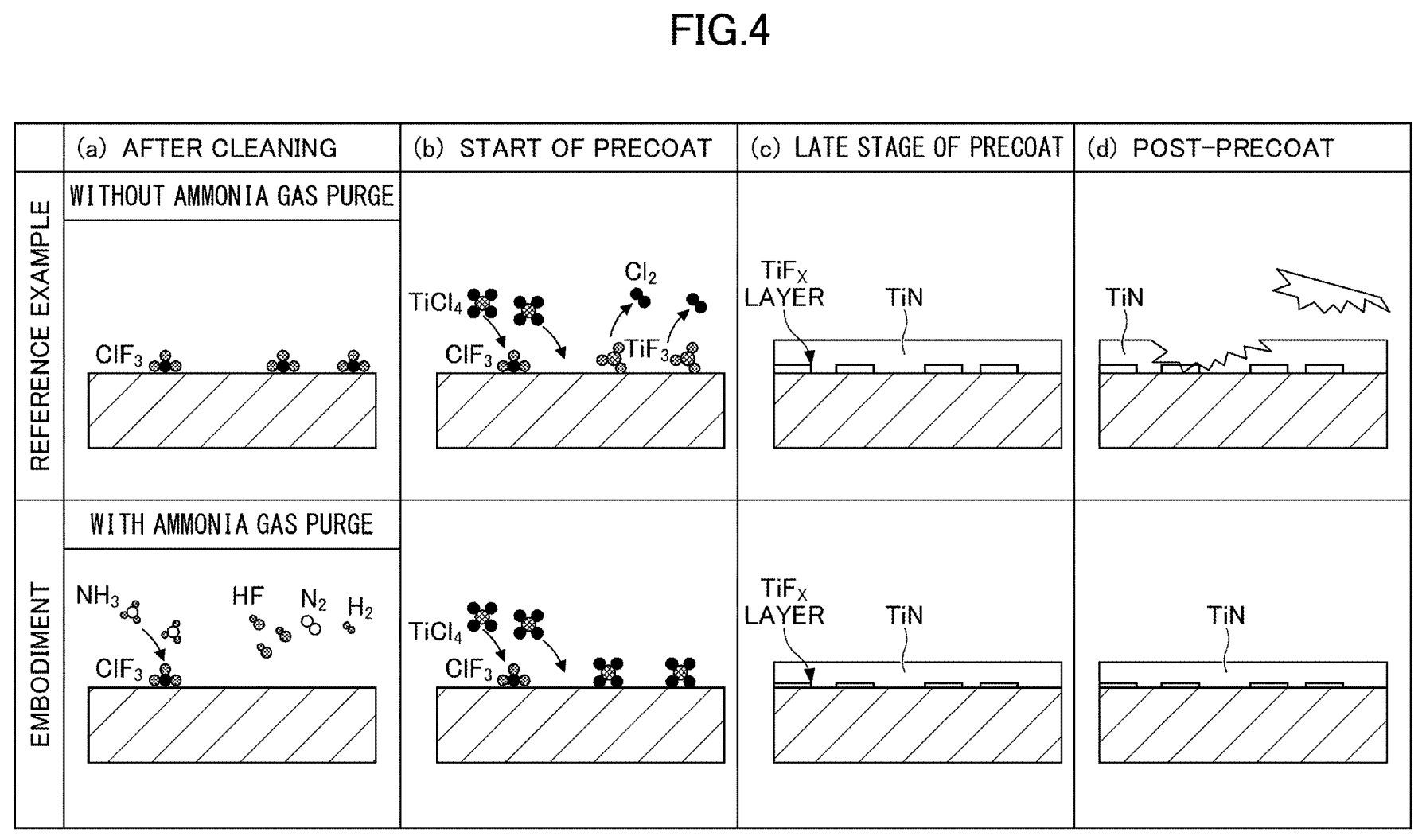

(a) AFTER CLEANING
(b) START OF PRECOAT
(c) LATE STAGE OF PRECOAT
(d) POST-PRECOAT
REFERENCE EXAMPLE
WITHOUT AMMONIA GAS PURGE
$ClF_3$
$TiCl_4$
$ClF_3$
$Cl_2$
$TiF_3$
$TiF_X$ LAYER
TiN
TiN
EMBODIMENT
WITH AMMONIA GAS PURGE
$NH_3$
HF
$N_2$
$H_2$
$ClF_3$
$TiCl_4$
$ClF_3$
$TiF_X$ LAYER
TiN
TiN

| | MEDIAN | MAXIMUM |
|---|---|---|
| REFERENCE EXAMPLE 1 | 369 | 5399 |
| REFERENCE EXAMPLE 2 | 140 | 272 |
| REFERENCE EXAMPLE 3 | 90 | 198 |

| | MEDIAN | MAXIMUM |
|---|---|---|
| REFERENCE EXAMPLE 1 | 369 | 5399 |
| REFERENCE EXAMPLE 4 | 372 | 9383 |
| REFERENCE EXAMPLE 5 | 162 | 1471 |

| | MEDIAN | MAXIMUM |
|---|---|---|
| REFERENCE EXAMPLE 1 | 369 | 5399 |
| REFERENCE EXAMPLE 5 | 162 | 1471 |
| FIRST EMBODIMENT | 85 | 424 |
| SECOND EMBODIMENT | 57 | 102 |

$TiCl_4:ClF_3=1:2$
T
EQUILIBRIUM AMOUNT [kmol]
2.5
2.0
1.5
1.0
0.5
0.0
0
50
100
150
200
250
300
TEMPERATURE [°C]
$Cl_2(g)$
$N_2(g)$
$TiF_4$
$TiF_4(g)$
$Cl_2(g)$
$N_2(g)$
$TiF_4(g)$
$TiF_4$ $TiCl_4:ClF_3=2:1$
T
EQUILIBRIUM AMOUNT [kmol]
3.0
2.5
2.0
1.5
1.0
0.5
0.0
0
50
100
150
200
250
300
TEMPERATURE [°C]
$Cl_2(g)$
$TiCl_4(g)$
$N_2(g)$
$TiF_3$
$TiF_4(g)$
$TiF_4$
$Cl_2(g)$
$TiCl_4(g)$
$N_2(g)$
$TiF_3$
$TiF_4(g)$
$TiF_4$ $NH_3:ClF_3=2:1$
T
EQUILIBRIUM AMOUNT [kmol]
3.5
3.0
2.5
2.0
1.5
1.0
0.5
0.0
0
50
100
150
200
250
300
TEMPERATURE [°C]
$HF(g)$
$N_2(g)$
$NH_4Cl$
$HCl(g)$
$H_2(g)$
$H_2F_2(g)$
$H_2(g)$
$HCl(g)$
$HF(g)$
$H_2F_2(g)$
$N_2(g)$
$NH_4Cl$

PRECOAT METHOD FOR SUBSTRATE PROCESSING APPARATUS AND SUBSTRATE PROCESSING APPARATUS

CROSS-REFERENCE TO RELATED APPLICATIONS

The present application is based on and claims priority to Japanese Patent Application No. 2022-198124 filed on Dec. 12, 2022, the contents of which are incorporated herein by reference in their entirety.

BACKGROUND OF THE INVENTION

Field of the Invention

The present disclosure relates to a precoat method for a substrate processing apparatus and a substrate processing apparatus.

Description of the Related Art

For example, Japanese Laid-Open Patent Publication No. 2004-288903 proposes a substrate processing apparatus for forming a $Si_3N_4$ film on a wafer by a thermal CVD method by supplying a deposition gas into a reactor in a deposition process. In the substrate processing apparatus, a cleaning process is executed in which the thin film deposited in the reactor through repeated deposition processes is removed and the inside of the reactor is cleaned. The cleaning process is performed by the thermal CVD method by supplying $NF_3$ gas into the reactor in a state where wafers are not housed. After the cleaning, $NH_3$ gas is supplied to the reactor in a state where wafers are not housed, while the pressure in the reactor is higher than the pressure in the reactor during the deposition process, and the reactor is purged. Further, after the purge, the deposition gas is supplied to the reactor in a state where wafers are not housed, while the pressure in the reactor is lower than the pressure in the reactor during the purge process, and a thin film is coated in the reactor by the thermal CVD method.

For example, Japanese Laid-Open Patent Publication No. 2010-34362 provides a substrate processing apparatus which can prevent by-products generated during substrate processing from flowing back to the gas supply line. The substrate processing apparatus includes: a processing chamber for processing a wafer; a process gas supply pipe that supplies process gas for processing the wafer into the processing chamber; a cleaning gas supply pipe that is connected so as to merge with the process gas supply pipe and supplies cleaning gas into the processing chamber for cleaning the inside of the processing chamber; and a controller that controls the cleaning gas supply line to supply the cleaning gas into the processing chamber, to remove deposits adhered to the processing chamber, and to clean the inside of the processing chamber.

SUMMARY OF THE INVENTION

According to one aspect of the present disclosure, a precoat method for a substrate processing apparatus for depositing on a substrate using a raw material gas and a reducing gas is provided. The method includes: a) supplying a fluorine-containing gas into a processing chamber to clean an inside of the processing chamber; b) after a), supplying a reducing gas into the processing chamber to purge the inside of the processing chamber; c) after b), supplying a raw material gas and a reducing gas into the processing chamber to form a precoat film; and d) after c), supplying a reducing gas into the processing chamber to purge the inside of the processing chamber before depositing on a subsequent substrate.

BRIEF DESCRIPTION OF THE DRAWINGS

FIG. 4 is a diagram schematically illustrating a state on a surface of a part in a purge process of $NH_3$ gas, a precoat process, and a post-precoat process;

DESCRIPTION OF THE EMBODIMENTS

Figure 1:
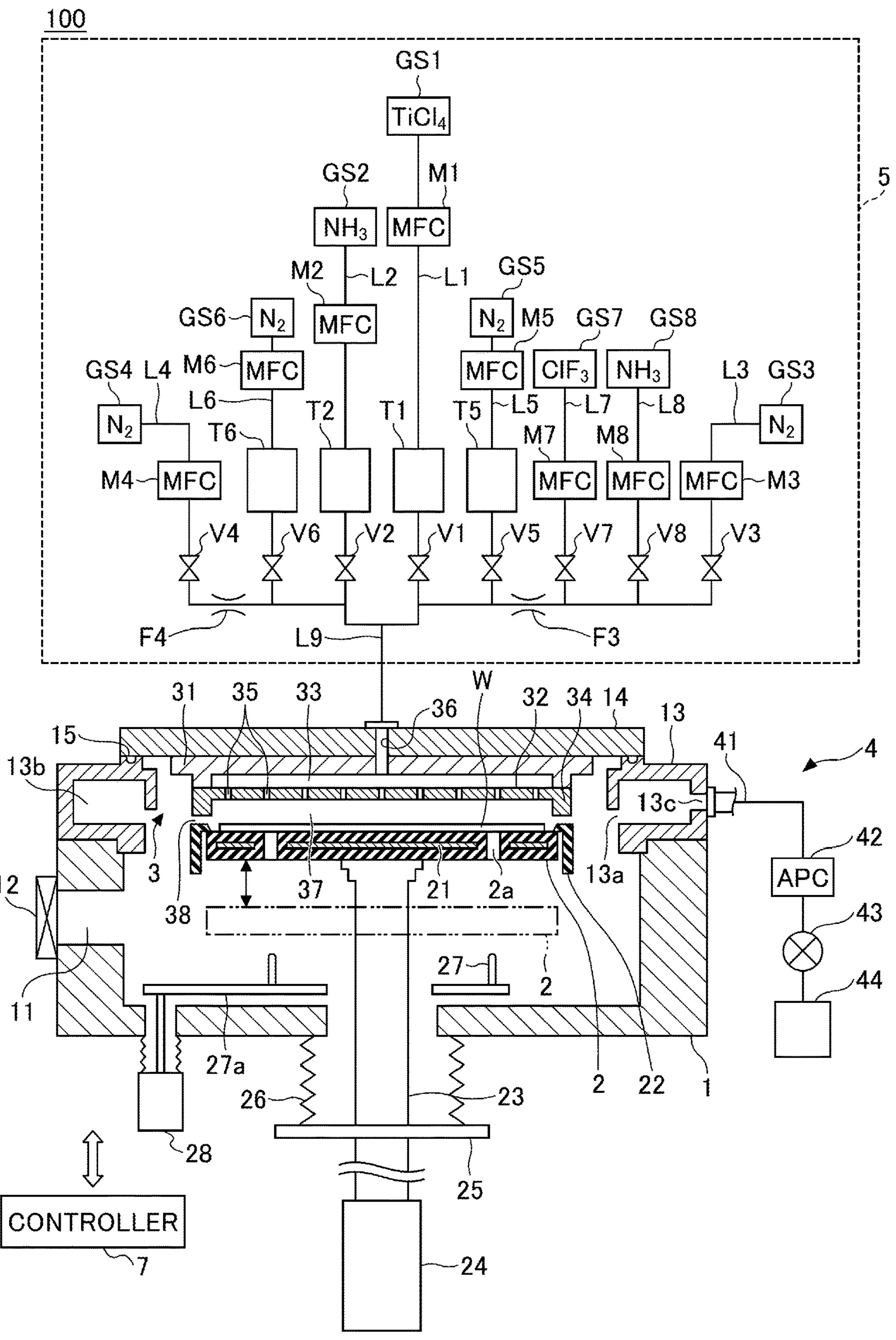
FIG. 1 is a schematic cross-sectional view illustrating an example of a substrate processing apparatus according to an embodiment.

Hereinafter, embodiments of the present disclosure will be described with reference to the accompanying drawings. In all accompanying drawings, the same components are denoted by the same reference numerals, and overlapping descriptions may be omitted.

Substrate Processing Apparatus

An example of a configuration of a substrate processing apparatus 100 according to one embodiment will be described with reference to FIG. 1. FIG. 1 is an example of a schematic cross-sectional view of the substrate processing apparatus 100 according to one embodiment.

The substrate processing apparatus 100 is an atomic layer deposition (ALD) apparatus for depositing a TiN film on a surface of a substrate W, for example a wafer, by supplying $TiCl_4$ gas, an example of a raw material gas, and $NH_3$ gas, an example of a reducing gas, to the substrate W.

The substrate processing apparatus 100 includes a processing chamber 1, a substrate mounting table 2, a shower head 3, an exhauster 4, a process gas supplier 5, and a controller 7.

The processing chamber 1 is composed of a metal such as aluminum and has a substantially cylindrical shape. A loading port 11 for carrying in or out the substrate W is formed on the side wall of the processing chamber 1. The loading port 11 can be opened and closed by a gate valve 12. An annular exhaust duct 13 having a substantially rectangular cross section is provided on the main body of the processing chamber 1. A slit 13*a* is formed along the inner peripheral surface of the exhaust duct 13. A ring-shaped exhaust space 13*b* is formed in the exhaust duct 13. An exhaust port 13*c* is formed on the outer wall of the exhaust duct 13. A top wall 14 is provided on the upper surface of the exhaust duct 13 so as to close the upper opening of the processing chamber 1. The space between the top wall 14 and the exhaust duct 13 is hermetically sealed with a seal ring 15.

The substrate mounting table 2 supports the substrate W horizontally in the processing chamber 1. The substrate mounting table 2 forms a disk shape of a size corresponding to the substrate W and is supported by a support member 23. The substrate mounting table 2 is composed of a ceramic material such as aluminum nitride (AlN) or a metal material such as aluminum or a nickel-based alloy, and a heater 21 for heating the substrate W is embedded therein. The heater 21 generates heat by supplying power from a heater power supply (not illustrated). The substrate W is controlled at a predetermined temperature by controlling the output of the heater 21 based on a temperature signal detected by a thermocouple (not illustrated) provided near the wafer mounting surface on the upper surface of the substrate mounting table 2.

The substrate mounting table 2 is provided with a cover member 22 made of a ceramic such as alumina to cover the outer peripheral region of the wafer mounting surface and the side surface of the substrate mounting table 2. The support member 23 extends downward from the center of the bottom of the substrate mounting table 2 and from the processing chamber 1, through a hole formed in the bottom wall of the processing chamber 1, and the lower end thereof is connected to the lifting mechanism 24. The lifting mechanism 24 allows the substrate mounting table 2 to move upward and downward via the support member 23 between the processing position illustrated in FIG. 1 and the transfer position below the processing position, indicated in a two-dot chain line, where the wafer can be transferred. A flange 25 is attached to the support member 23 below the processing chamber 1. A bellows 26 is provided between the bottom of the processing chamber 1 and the flange 25, which separates the atmosphere inside the processing chamber 1 from the outside air and expands and contracts with the lifting and lowering operation of the substrate mounting table 2.

Three (only two illustrated) wafer support pins 27 are provided near the bottom of the processing chamber 1 so as to protrude upward from the lifting plate 27*a*. The wafer support pins 27 can be lifted and lowered via the lifting plate 27*a* by the lifting mechanism 28 provided below the processing chamber 1, and are inserted into the through holes 2*a* provided in the substrate mounting table 2 at the transfer position so as to protrude and retract with respect to the upper surface of the substrate mounting table 2. By lifting and lowering the wafer support pins 27 in this manner, the substrate W is transferred between the wafer transfer mechanism (not illustrated) and the substrate mounting table 2.

The shower head 3 supplies the process gas into the processing chamber 1 like a shower. The shower head 3 is made of metal, is provided so as to face the substrate mounting table 2, and has a diameter almost the same as that of the substrate mounting table 2. The shower head 3 includes a body 31 fixed to the top wall 14 of the processing chamber 1 and a shower plate 32 connected under the body 31. A gas diffusion space 33 is formed between the body 31 and the shower plate 32. A gas introduction hole 36 is provided in the gas diffusion space 33 so as to penetrate the center of the body 31 and the top wall 14 of the processing chamber 1. An annular projection 34 projecting downward is formed on the peripheral edge of the shower plate 32. Gas discharge holes 35 are formed on a flat surface of the shower plate 32 inside the annular projection 34.

When the substrate mounting table 2 is in the processing position, a processing space 37 is formed between the shower plate 32 and the substrate mounting table 2. The annular projection 34 and the upper surface of the cover member 22 of the substrate mounting table 2 are close to each other to form an annular gap 38.

The exhauster 4 exhausts the inside of the processing chamber 1. The exhauster 4 includes an exhaust line 41, a pressure adjuster (auto pressure controller: APC) 42, a valve 43, and a vacuum pump 44. One end of the exhaust line 41 is connected to an exhaust port 13*c* of the exhaust duct 13, and the other end is connected to an intake port of the vacuum pump 44. Between the exhaust duct 13 and the vacuum pump 44, the pressure adjuster 42 and the valve 43 are provided in order from upstream. The pressure adjuster 42 adjusts the fluid conductance of the exhaust path to adjust the pressure of the processing space 37. The valve 43 switches the opening and closing of the exhaust line 41. In processing, the gas in the processing space 37 reaches the exhaust space 13*b* of the exhaust duct 13 through the annular gap 38 and the slit 13*a*, and is exhausted from the exhaust port 13*c* of the exhaust duct 13 through the exhaust line 41 by the vacuum pump 44 of the exhauster 4.

The process gas supplier 5 includes a raw material gas supply line L1, a reducing gas supply line L2, a first continuous $N_2$ gas supply line L3, a second continuous $N_2$ gas supply line L4, a first purge line L5, and a second purge line L6. Further, the process gas supplier 5 includes a cleaning gas supply line L7 and an ammonia purge gas supply line L8.

The raw material gas supply line L1 extends from a raw material gas supply source GS1, which is a supply source of a metal-containing gas, for example, $TiCl_4$ gas, and is connected to a confluence pipe L9. The confluence pipe L9 is connected to the gas introduction hole 36. The raw material gas supply line L1 is provided with a mass flow controller M1, a buffer tank T1, and an opening/closing valve V1 in order from the raw material gas supply source GS1 side. The mass flow controller M1 controls the flow rate of the $TiCl_4$ gas flowing through the raw material gas supply line L1. The buffer tank T1 temporarily stores the $TiCl_4$ gas and supplies the required $TiCl_4$ gas in a short time. The opening/closing valve V1 switches the supply/stop of the $TiCl_4$ gas during the atomic layer deposition (ALD) process.

The reducing gas supply line L2 extends from a reducing gas supply source GS2, which is a supply source of a reducing gas (a nitrogen-containing gas), for example, $NH_3$ gas, and is connected to the confluence pipe L9. The reducing gas supply line L2 is provided with a mass flow controller M2, a buffer tank T2, and an opening/closing valve V2 in order from the reducing gas supply source GS2 side. The mass flow controller M2 controls the flow rate of the $NH_3$ gas flowing through the reducing gas supply line L2. The buffer tank T2 temporarily stores the $NH_3$ gas and supplies the required $NH_3$ gas in a short time. The opening/closing valve V2 switches the supply/stop of the $NH_3$ gas during the ALD process.

The first continuous $N_2$ gas supply line L3 extends from a $N_2$ gas supply source GS3, which is a supply source of $N_2$ gas, and is connected to the raw material gas supply line L1. Thus, the $N_2$ gas is supplied to the raw material gas supply line L1 via the first continuous $N_2$ gas supply line L3. The first continuous $N_2$ gas supply line L3 constantly supplies the $N_2$ gas during deposition by the ALD method, which functions as a carrier gas for $TiCl_4$ gas and also as a purge gas. The first continuous $N_2$ gas supply line L3 is provided with a mass flow controller M3, an opening/closing valve V3, and an orifice F3 in order from the $N_2$ gas supply source GS3 side. The mass flow controller M3 controls the flow rate of the $N_2$ gas flowing through the first continuous $N_2$ gas supply line L3. The orifice F3 prevents the relatively large flow rate of gas supplied by the buffer tanks T1 and T5 from flowing back to the first continuous $N_2$ gas supply line L3.

The second continuous $N_2$ gas supply line L4 extends from a $N_2$ gas supply source GS4, which is a supply source of $N_2$ gas, and is connected to the reducing gas supply line L2. Thus, the $N_2$ gas is supplied to the reducing gas supply line L2 via the second continuous $N_2$ gas supply line L4. The second continuous $N_2$ gas supply line L4 constantly supplies the $N_2$ gas during deposition by the ALD method, which functions as a carrier gas for $NH_3$ gas and also as a purge gas. The second continuous $N_2$ gas supply line L4 is provided with a mass flow controller M4, an opening/closing valve V4, and an orifice F4 in order from the $N_2$ gas supply source GS4 side. The mass flow controller M4 controls the flow rate of the $N_2$ gas flowing through the second continuous $N_2$ gas supply line L4. The orifice F4 prevents the relatively large flow rate of gas supplied by the buffer tanks T2 and T6 from flowing back to the second continuous $N_2$ gas supply line L4.

The first purge line L5 extends from a $N_2$ gas supply source GS5, which is a supply source of $N_2$ gas, and is connected to the first continuous $N_2$ gas supply line L3. Thus, the $N_2$ gas is supplied to the raw material gas supply line L1 via the first purge line L5 and the first continuous $N_2$ gas supply line L3. The first purge line L5 supplies the $N_2$ gas only during the purge process during deposition in the ALD method. The first purge line L5 is provided with a mass flow controller M5, a buffer tank T5, and an opening/closing valve V5 in order from the $N_2$ gas supply source GS5 side. The mass flow controller M5 controls the flow rate of the $N_2$ gas flowing through the first purge line L5. The buffer tank T5 temporarily stores the $N_2$ gas and supplies the required $N_2$ gas in a short time. The opening/closing valve V5 switches the supply/stop of the $N_2$ gas during purging in the ALD process.

The second purge line L6 extends from a $N_2$ gas supply source GS6, which is a supply source of $N_2$ gas, and is connected to the second continuous $N_2$ gas supply line L4. Thus, the $N_2$ gas is supplied to the reducing gas supply line L2 via the second purge line L6 and the second continuous $N_2$ gas supply line L4. The second purge line L6 supplies the $N_2$ gas only during the purge process during deposition in the ALD method. The second purge line L6 is provided with a mass flow controller M6, a buffer tank T6, and an opening/closing valve V6 in order from the $N_2$ gas supply source GS6 side. The mass flow controller M6 controls the flow rate of the $N_2$ gas flowing through the second purge line L6. The buffer tank T6 temporarily stores the $N_2$ gas and supplies the required $N_2$ gas in a short time. The opening/closing valve V6 switches the supply/stop of the $N_2$ gas during purging in the ALD process.

The cleaning gas supply line L7 extends from a $ClF_3$ gas supply source GS7, which is a supply source of a cleaning gas (a fluorine-containing gas), for example, $ClF_3$ gas, and is connected to the first continuous $N_2$ gas supply line L3. Thus, the cleaning gas is supplied to the raw material gas supply line L1 via the cleaning gas supply line L7 and via the first continuous $N_2$ gas supply line L3. The cleaning gas supply line L7 is provided with a mass flow controller M7 and an opening/closing valve V7 in order from the $ClF_3$ gas supply source GS7 side. The mass flow controller M7 controls the flow rate of the cleaning gas flowing through the cleaning gas supply line L7. The opening/closing valve V7 switches the supply/stop of the $ClF_3$ gas during cleaning.

The ammonia purge gas supply line L8 extends from an $NH_3$ gas supply source GS8, which is a supply source of ammonia gas, and is connected to the first continuous $N_2$ gas supply line L3. Thus, the $NH_3$ gas is supplied to the raw material gas supply line L1 via the ammonia purge gas supply line L8 and the first continuous $N_2$ gas supply line L3. The ammonia purge gas supply line L8 is provided with a mass flow controller M8 and an opening/closing valve V8 in order from the $NH_3$ gas supply source GS8 side. The mass flow controller M8 controls the flow rate of the $NH_3$ gas flowing through the ammonia purge gas supply line L8. The opening/closing valve V8 switches the supply/stop of the $NH_3$ gas during the purge process using the $NH_3$ gas.

The controller 7 controls the operation of each part of the substrate processing apparatus 100. The controller 7 includes a central processing unit (CPU), a read only memory (ROM), and a random access memory (RAM). The CPU executes a desired process according to a recipe stored in a storage area such as the RAM. The recipe includes control information of the apparatus for process conditions. Examples of the control information include, for example, gas flow rate, pressure, temperature, and process time. The recipe and the program used by the controller 7 may be stored in, for example, a hard disk or a semiconductor memory. The recipe and the like may be stored in a portable computer-readable storage medium such as a CD-ROM or DVD, set in place, and read out.

Figure 2:
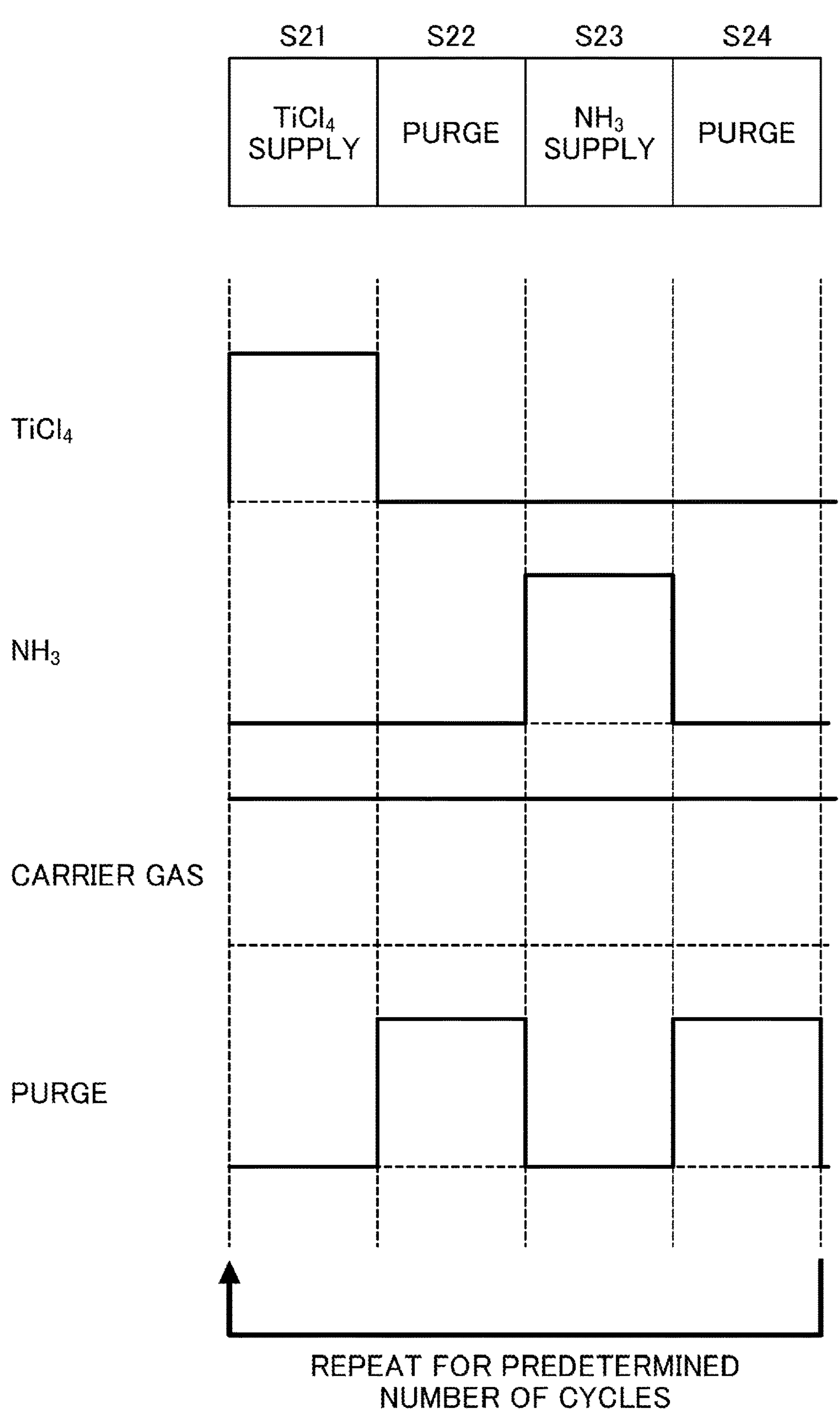
FIG. 2 is an example of a gas supply sequence in the substrate processing apparatus according to an embodiment.

Next, a deposition process of a metal-containing film in the substrate processing apparatus 100 will be described with reference to the case where a TiN film is formed on the substrate W by the ALD process. FIG. 2 is a diagram illustrating an example of a gas supply sequence in the substrate processing apparatus 100 according to one embodiment.

First, the substrate W is transferred into the processing chamber 1 of the substrate processing apparatus 100. Specifically, the gate valve 12 is opened in a state in which the substrate mounting table 2 heated to a predetermined temperature (for example, 300° C. to 700° C.) by the heater 21 is lowered to the transfer position (indicated by a two-dot chain line in FIG. 1). Subsequently, the substrate W is conveyed into the processing chamber 1 through the loading port 11 by the transfer arm (not illustrated) and supported by the wafer support pins 27. When the transfer arm is evacuated from the loading port 11, the gate valve 12 is closed. The wafer support pins 27 are lowered to place the substrate W on the substrate mounting table 2. Subsequently, the substrate mounting table 2 is raised to the processing position (indicated by a solid line in FIG. 1), and the inside of the processing chamber 1 is depressurized to a predetermined vacuum degree. Thereafter, the opening/closing valves V3 and V4 are opened, and the opening/closing valves V1, V2, and V5 to V8 are closed. Thus, the $N_2$ gas is supplied into the processing chamber 1 from the $N_2$ gas supply sources GS3 and GS4 through the first continuous $N_2$ gas supply line L3 and the second continuous $N_2$ gas supply line L4 to increase the pressure and stabilize the temperature of the substrate W on the substrate mounting table 2. At this time, $TiCl_4$ gas is supplied into the buffer tank T1 from the raw material gas supply source GS1, and the pressure in the buffer tank T1 is maintained at a substantially constant level. The $N_2$ gas is supplied into the buffer tanks T5 and T6 from the $N_2$ gas supply sources GS5 and GS6, and the pressure in the buffer tanks T5 and T6 is maintained at a substantially constant level.

Subsequently, the TiN film is deposited by the ALD process using the $TiCl_4$ gas and the $NH_3$ gas. The ALD process repeats a $TiCl_4$ supply process S21, a first purge process S22, an $NH_3$ supply process S23, and a second purge process S24 for a predetermined cycle to form a TiN film having a desired film thickness on the substrate W.

The $TiCl_4$ supply process S21 is a process of supplying the $TiCl_4$ gas into the processing space 37. In the $TiCl_4$ supply process S21, $N_2$ gas (continuous $N_2$ gas) is supplied from the $N_2$ gas supply sources GS3 and GS4 through the first continuous $N_2$ gas supply line L3 and the second continuous $N_2$ gas supply line L4 with the opening/closing valves V3 and V4 open. The $TiCl_4$ gas is supplied from the raw material gas supply source GS1 through the raw material gas supply line L1 to the processing space 37 in the processing chamber 1 by opening the opening/closing valve V1. At this time, the $TiCl_4$ gas is temporarily stored in the buffer tank T1 and then supplied into the processing chamber 1. As a result, the $TiCl_4$ gas is adsorbed on the surface of the substrate W.

The first purge process S22 is a process of purging the excess $TiCl_4$ gas and the like in the processing space 37. In the first purge process S22, the opening/closing valve V1 is closed to stop the supply of $TiCl_4$ gas while the supply of the $N_2$ gas (continuous $N_2$ gas) through the first continuous $N_2$ gas supply line L3 and the second continuous $N_2$ gas supply line L4 is continued. The opening/closing valves V5 and V6 are also opened. Thus, the $N_2$ gas is supplied from the $N_2$ gas supply sources GS5 and GS6 to the processing space 37 in the processing chamber 1 via the first purge line L5 and the second purge line L6. At this time, the $N_2$ gas is supplied to the processing chamber 1 after being temporarily stored in the buffer tanks T5 and T6, so that a relatively large flow rate can be supplied. Thus, excess $TiCl_4$ gas and the like in the processing space 37 are purged.

The $NH_3$ supply process S23 is a process of supplying the $NH_3$ gas into the processing space 37. In the $NH_3$ supply process S23, the opening/closing valve V2 is opened in a state where the supply of the $N_2$ gas (continuous $N_2$ gas) through the first continuous $N_2$ gas supply line L3 and the second continuous $N_2$ gas supply line L4 is continued. The opening/closing valves V5 and V6 are closed. Thus, the $NH_3$ gas is supplied to the processing space 37 from the reducing gas supply source GS2 through the reducing gas supply line L2. At this time, the $NH_3$ gas is temporarily stored in the buffer tank T2 and then supplied into the processing chamber 1. Thus, the $TiCl_4$ adsorbed on the substrate W is reduced. The flow rate of the $NH_3$ gas at this time can be set to a sufficient amount for the reduction reaction to occur.

The second purge process S24 is a process of purging excess $NH_3$ gas in the processing space 37. In the second process of supplying $N_2$ gas, the opening/closing valve V2 is closed to stop the supply of the $NH_3$ gas while the supply of the $N_2$ gas (continuous $N_2$ gas) through the first continuous $N_2$ gas supply line L3 and the second continuous $N_2$ gas supply line L4 is continued. The opening/closing valves V5 and V6 are opened. Thus, the $N_2$ gas is supplied from the $N_2$ gas supply sources GS5 and GS6 to the processing space 37 in the processing chamber 1 via the first purge line L5 and the second purge line L6. At this time, the $N_2$ gas is supplied to the processing chamber 1 after being temporarily stored in the buffer tanks T5 and T6, so that a relatively large flow rate can be supplied. Thus, excess $NH_3$ gas and the like in the processing space 37 is purged.

Hereinafter, the steps S21 to S24 are repeated for a predetermined cycle to form a TiN film having a desired film thickness on the substrate W. In the depositing process of the substrate W described above, a film is also deposited on the inner wall of the processing chamber 1 and on the parts in the processing chamber 1. The deposited film is peeled off into particles, which affect the depositing process of the substrate W. Therefore, cleaning and coating with a precoat film are performed under predetermined conditions.

Figure 3:
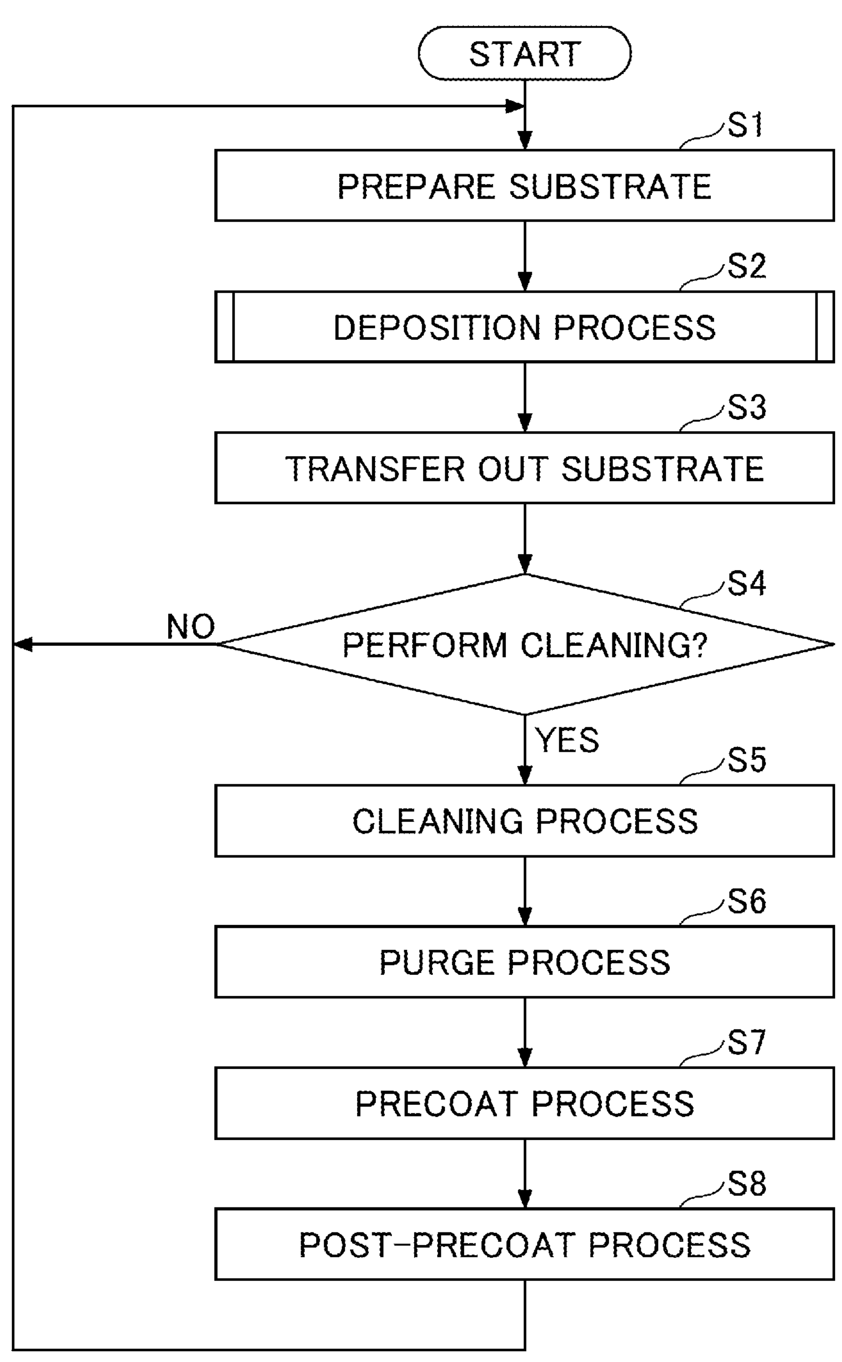
FIG. 3 is a flowchart illustrating an example of a precoat method for the substrate processing apparatus according to an embodiment.

FIG. 3 is a flowchart illustrating an example of a precoat process of the substrate processing apparatus 100 according to one embodiment. Step S21 to S24 in FIG. 2 are specific examples of the deposition process performed in step S2 for the substrate W prepared on the substrate mounting table 2 in step S1 of FIG. 3. After the TiN film is formed on the substrate W, the substrate W is performed in step S3.

[Cleaning Process]

After carrying out the substrate W, in step S4, the controller 7 determines whether to execute the process of cleaning the inside of the processing chamber 1. For example, the controller 7 may determine whether to execute cleaning based on whether the number of processed substrates W after the most recent cleaning has exceeded a certain number. The number of the processed substrates W may be set in advance to the number that needs to be cleaned.

When the controller 7 determines in step S4 that cleaning is not performed, the controller 7 returns to step S1, carries in a subsequent substrate W, and carries out the substrate W after forming a TiN film on the substrate W in steps S2 and S3.

When it is determined in step S4 that cleaning is to be performed, the controller 7 proceeds to step S5 and supplies $ClF_3$ gas, which is an example of a fluorine-containing gas, into the processing chamber 1 to clean the inside of the processing chamber 1. The processing chamber 1 to be cleaned includes parts (a gas diffusion space 33, a gas discharge hole 35, and the like) constituting a gas flow path.

In the cleaning process in step S5, the opening/closing valve V7 illustrated in FIG. 1 is opened, and the other opening/closing valves V1 to V6 and V8 are closed. Thus, the $ClF_3$ gas is supplied to the processing space 37 from the $ClF_3$ gas supply source GS7 through the cleaning gas supply line L7. Thus, the TiN film in the processing chamber 1 can be removed.

[Purge Process]

After the cleaning process, the controller 7 supplies ammonia ($NH_3$) gas, which is an example of a reducing gas, into the processing chamber 1 in step S6, and purges the inside of the processing chamber 1. The reducing gas supplied in step S6 may be the same gas as the reducing gas used for deposition of the substrate W. In the present embodiment, the reduction gas supplied in step S6 and the reduction gas used for depositing on the substrate W are both the $NH_3$ gas.

In the purge process in step S6, the $ClF_3$ gas and the like adsorbed and remaining in the processing space 37 and the processing chamber 1 is purged. In the purge process in step S6, the opening/closing valve V7 is closed to stop the supply of the $ClF_3$ gas. The opening/closing valve V8 is also opened. As a result, the $NH_3$ gas is supplied to the processing space 37 from the $NH_3$ gas supply source GS8 through the ammonia purge gas supply line L8. At this time, the $NH_3$ gas is supplied at a constant flow rate of, for example, 9,000 sccm for three hours. The $NH_3$ gas may be supplied at a large flow of 9,000 sccm or more. The $NH_3$ gas may be supplied at a constant flow rate for three hours or more. In the purge process of step S6, the $NH_3$ gas is not stored in the buffer tank before being supplied. The reason for this is that, in the purge process of step S6, it is important to increase the $NH_3$ gas supply time to a certain extent in order to accelerate the chemical reaction represented by the following chemical reaction formula (1). When the $NH_3$ gas is supplied after being stored in the buffer tank, the $NH_3$ gas is not supplied while the $NH_3$ gas is stored in the buffer tank, so that the $NH_3$ gas supply time is shortened. Thus, when the $NH_3$ gas is supplied after being stored in the buffer tank, the reaction is less likely to be accelerated.

<Chemical Reaction Formula (1) in Purge Process>

$$NH_3+ClF_3=HF(g)+HCl(g)+N_2(g)+H_2(g)$$

FIG. 4 is a diagram schematically illustrating a gas adsorption state on the surface of a part (a gas flow path, and the like) in the processing chamber 1 in the purge process of the $NH_3$ gas (FIG. 3, step S6), the precoat process (step S7), and the post-precoat process (step S8). The upper row of FIG. 4 presents the surface state of the part at each time point of: (a) after the cleaning (without $NH_3$ gas purge); (b) start of the precoat; (c) late stage of the precoat; and (d) the post-precoat; in Reference Example. The lower row of FIG. 4 presents the surface state of the part at each time point of: (a) after the cleaning (with $NH_3$ gas purge); (b) start of the precoat; (c) late stage of the precoat; and (d) the post-precoat; in the embodiment.

In Reference Example, (a) after the cleaning process, the purge process using the $NH_3$ gas (step S6 in FIG. 3) is not performed. In this case, the $ClF_3$ of the cleaning gas is adsorbed on the surface of the part.

In contrast, in the embodiment, (a) after the cleaning process, the purge process using the $NH_3$ gas (step S6 in FIG. 3) is performed. At this time, the $NH_3$ and the $ClF_3$ react according to the chemical reaction formula (1) to produce HF gas, HCl gas, $N_2$ gas, $H_2$ gas, and the like, and these gases are volatilized. As a result, the residual adsorbed $ClF_3$ is discharged as HF gas and the like, and as illustrated in FIG. 4 (*a*), in the embodiment, less $ClF_3$ is adsorbed on the surface of the part compared to Reference Example.

[Precoat Process]

Returning to FIG. 3, after the purge process in step S6, the controller 7 supplies the raw material gas and the reduction gas into the processing chamber 1 in step S7 to form a precoat film. The raw material gas and the reduction gas supplied in the precoat process are preferably the same gas as the raw material gas and the reduction gas used for the deposition on the substrate W. Thus, the same film (for example, a TiN film) as the film formed in the deposition process of the substrate W is formed as a precoat film on the parts in the processing chamber 1, and the deposition environment of the substrate W can be stabilized.

For example, in the precoat process, the TiN film is formed using the $TiCl_4$ gas and the $NH_3$ gas by the deposition method described with reference to FIGS. 1 and 2.

As illustrated in FIG. 4 (*a*), in the embodiment, by performing the purge process of the $NH_3$ gas after the cleaning process, the amount of $ClF_3$ adsorbed on the surface of the part is small compared to Reference Example without the purge process. Therefore, from the start of the precoat process illustrated in FIG. 4 (*b*), in Reference Example, the $TiCl_4$ gas is supplied in a state in which the $ClF_3$ is largely adsorbed, and the reaction represented by the following chemical reaction formula (2) occurs.

<Chemical Reaction Formula (2) in Precoat Process>

$$TiCl_4+ClF_3=TiF_x+Cl_2(g)$$

In Reference Example, because the $ClF_3$ is adsorbed on the surface of the part, a large amount of $TiF_x$ is generated. $TiF_x$ is a solid when it is $TiF_3$ and a gas when it is $TiF_4$. In Reference Example, a larger amount of $TiF_3$ is produced than in the embodiment, and at the late stage of the precoat process illustrated in FIG. 4 (*c*), a TiN film, which is a precoat film, is deposited on the $TiF_x$ layer.

In contrast, in the embodiment, because the amount of the $ClF_3$ adsorbed is decreased due to the purge process of the $NH_3$ gas, less $TiF_x$ is produced compared to Reference Example. Therefore, in the embodiment, less $TiF_3$ is produced compared to Reference Example, and at the late stage of the precoat process illustrated in FIG. 4 (*c*), a TiN film, which is the precoat film, is deposited on the $TiF_x$ layer, which is less (thinner) compared to Reference Example.

The less the $TiF_x$ layer at the interface of the parts, the higher the adhesion of the TiN film, which is the precoat film, and the harder it is for the TiN film to peel off. Thus, particles can be decreased.

[Post-Precoat Process]

Returning to FIG. 3, after the precoat process in step S7, the controller 7 supplies the reducing gas into the processing chamber 1 and purges the inside of the processing chamber 1 before depositing on a subsequent substrate W in step S8. After the process in step S8, the process returns to step S1, and a TiN film of the subsequent substrate is deposited in steps S1 to S3.

In the post-precoat process, $NH_3$ gas is used as the reducing gas to be supplied. In the post-precoat process, the $NH_3$ gas is temporarily stored in the buffer tank, and a high pressure of approximately 400 Torr (53,329 Pa) of the $NH_3$ gas is supplied from the buffer tank.

Specifically, with reference to FIG. 1, the opening/closing valve V2 is opened and other opening/closing valves are closed. Thus, the $NH_3$ gas is supplied to the processing space 37 from the reducing gas supply source GS2 via the reducing gas supply line L2. At this time, the $NH_3$ gas is temporarily stored in the buffer tank T2 and then supplied into the processing chamber 1.

The time for temporarily storing the $NH_3$ gas in the buffer tank T2 is approximately 0.7 seconds, and the time for supplying the $NH_3$ gas stored in the buffer tank T2 into the processing chamber 1 is approximately 0.3 seconds. In the post-precoat process, the supply of the $NH_3$ gas is stopped while the $NH_3$ gas is stored in the buffer tank T2 by closing the opening/closing valve V2, and then the opening/closing valve V2 is opened to supply the $NH_3$ gas stored in the buffer tank T2 into the processing chamber 1 at high flow rate. In other words, the pulse supply in which the $NH_3$ gas is supplied and stopped is performed. In the post-precoat process, the supply/stop of the $NH_3$ gas is repeated 1,200 times to supply a large flow of the $NH_3$ gas of approximately 9,000 sccm into the processing chamber 1 in approximately 20 minutes.

When the opening/closing valve V2 is opened, the $NH_3$ gas stored in the buffer tank T2 is supplied into the processing chamber 1 at high flow rate at a pressure of approximately 400 Torr. As a result, the weak part in the precoat film containing Cl remaining in the TiN film is removed by physically blowing them away with the $NH_3$ gas at high pressure. In addition, as illustrated in the chemical reaction formula (3), Cl in the precoat film reacts with $NH_3$, is reformed into HCl, and volatilizes, whereby Cl in the precoat film can also be removed. In this manner, by blowing a weak part of the precoat film away in advance in the post-precoat process immediately before the deposition and forming a strong precoat film, the generation of particles due to peeling of the precoat film in the deposition process can be decreased.

<Chemical Reaction Formula (3) in Post-Precoat Process>

$$TiN+Cl_2 \text{ in the precoat film}+NH_3=TiN+HCl(g)+N_2(g)$$

That is, $$TiN—Cl+NH_3=TiN+HCl(g)+N_2(g)$$

At this time, Cl is mostly residually adsorbed on TiN.

The $NH_3$ gas supplied in the post-precoat process does not need to be at a high pressure. The $NH_3$ gas supplied does not need to be at a large flow. When the $NH_3$ gas is not at a high pressure, the function of removing the weak part in the precoat film by physically blowing it away with the $NH_3$ gas at a high pressure is decreased, but the Cl in the precoat film reacts chemically with $NH_3$ and is reformed into HCl. Thus, a strong precoat film can be formed by volatilizing and removing HCl, and the generation of particles due to peeling of the precoat film in the deposition process can be decreased.

A large flow of $N_2$ gas and $H_2$ gas may be supplied together with the large flow of the $NH_3$ gas. When a large flow of $H_2$ gas is supplied, the $N_2$ gas is supplied from the first purge line L5 or the second purge line L6 illustrated in FIG. 1. A $H_2$ gas supply source (not illustrated), an MFC, a buffer tank, and an opening/closing valve may be provided to supply a large flow of $H_2$ gas from the $H_2$ gas supply source into the processing chamber 1.

In Reference Example illustrated in FIG. 4, in the post-precoat process illustrated in FIG. 4 (*d*), a high pressure $NH_3$ gas is supplied and a large flow of $N_2$ gas and $H_2$ gas is supplied. Then, because the $TiF_x$ layer at the interface is relatively large, the adhesion of the TiN film is decreased, and the TiN film of the precoat film is peeled off. As a result, particles are generated in the deposition process, which affects the deposition process of the substrate W.

In contrast, in the present embodiment, the precoat process is performed after reducing the $ClF_3$ that is residually adsorbed in the purge process using the $NH_3$ gas after the cleaning process. Therefore, because the $ClF_3$ that is residually adsorbed in the precoat process is decreased, the $TiF_x$ layer formed at the interface of the parts is decreased. As a result, the adhesion of the precoat film is higher compared to Reference Example. Therefore, even when a large flow of high pressure $NH_3$ gas is supplied and a large flow of $N_2$ gas and $H_2$ gas are supplied in the post-precoat process, the TiN film of the precoat film is less likely to peel off, and the generation of particles can be decreased in the deposition process.

[Experimental Result 1]

Figures 5A, 5B:
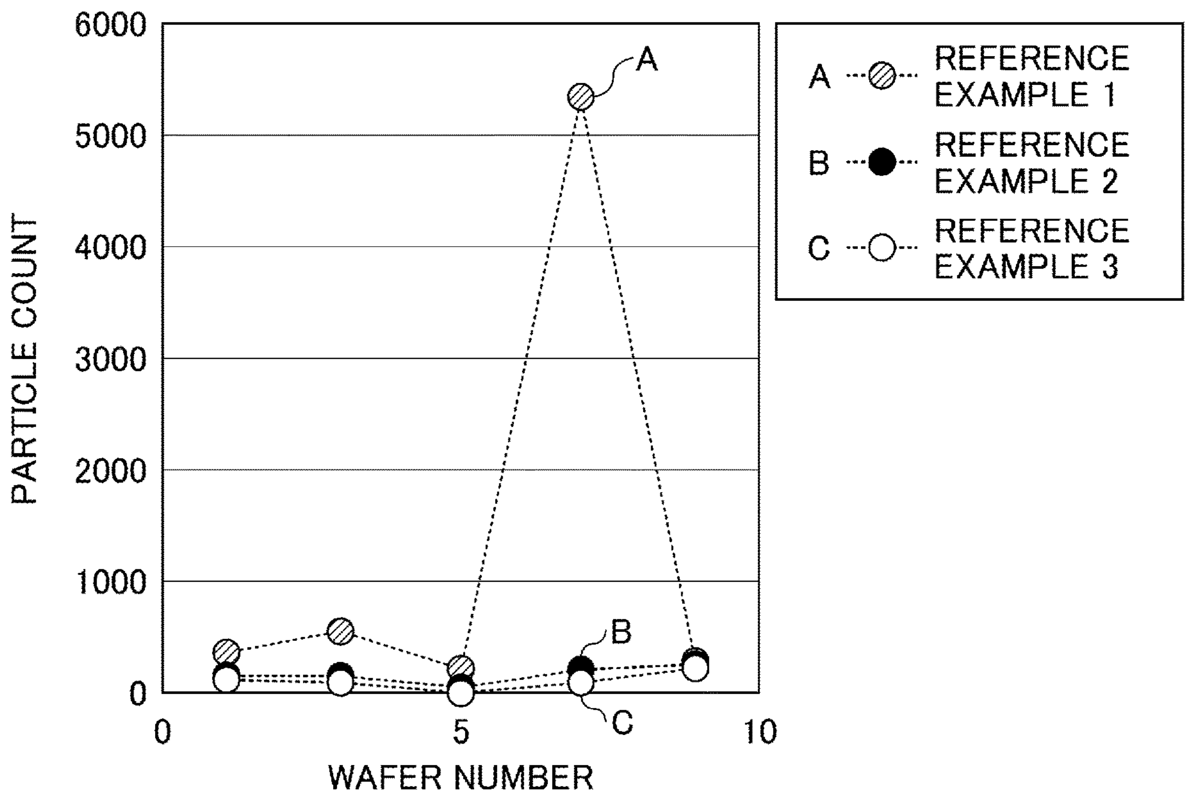
FIGS. 5A and 5B are an example of a number of particles generated by precoat methods of Reference Examples 1 to 3.
Figures 6A, 6B:
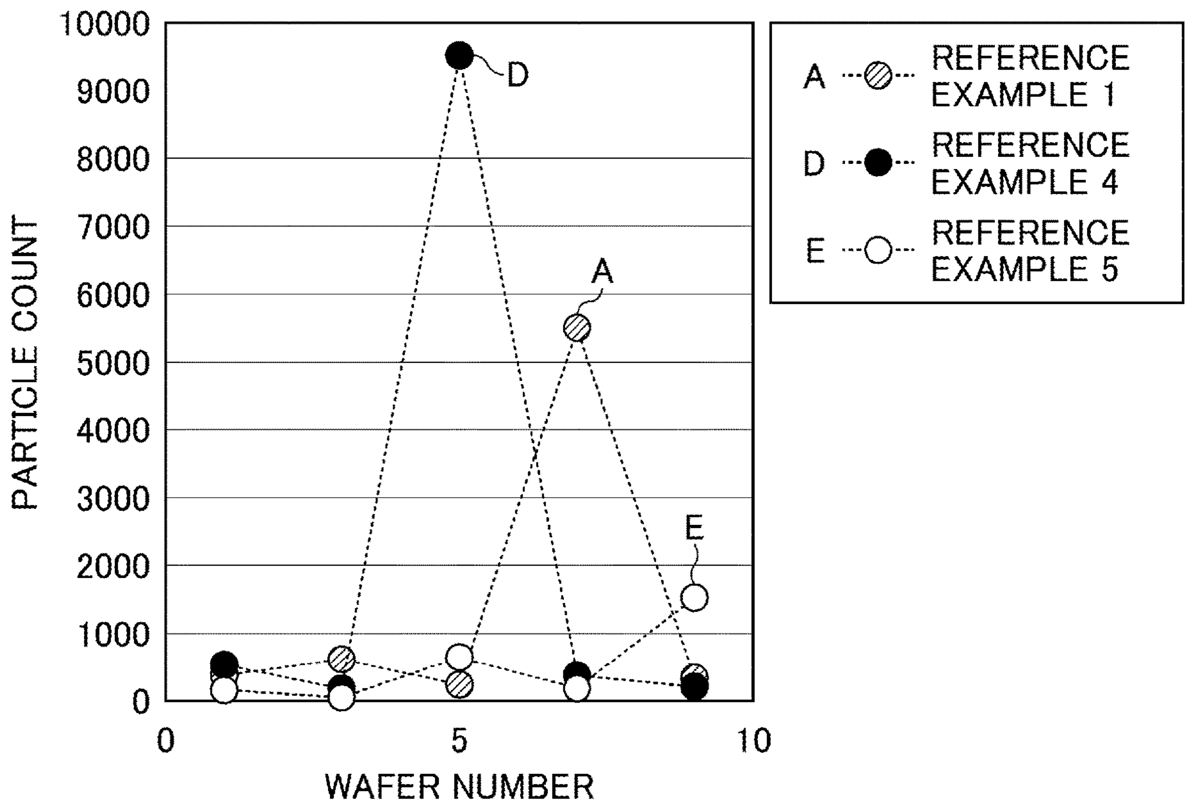
FIGS. 6A and 6B are an example of a number of particles generated by precoat methods of Reference Examples 1, 4, and 5.
Figures 7A, 7B:
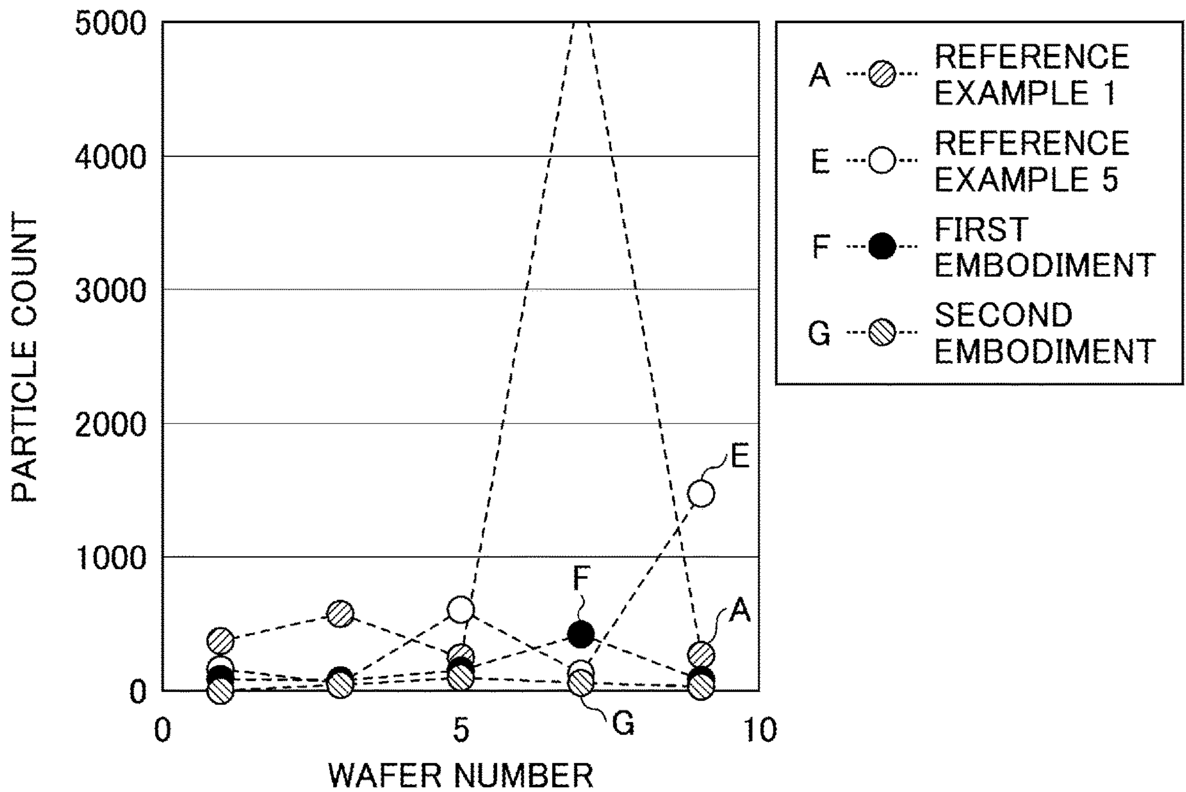
FIGS. 7A and 7B are an example of a number of particles generated by precoat methods of Reference Examples 1 and 5 and of the first embodiment and the second embodiment.

Referring to FIGS. 5A to 7B, an example of experimental results of the number of particles in Reference Example and the embodiment will be described. FIGS. 5A and 5B are an example of the number of particles generated by precoating of Reference Examples 1 to 3. FIGS. 6A and 6B are an example of the number of particles generated by precoating of Reference Examples 1, 4, and 5. FIGS. 7A and 7B are an example of the number of particles generated by the precoat method of Reference Examples 1, 5, the first embodiment, and the second embodiment. The numbers of substrates (wafers) on the horizontal axis of FIGS. 5A to 7B are assigned sequentially from the first wafer in the deposition process after the post-precoat process. The number of particles on the vertical axis of FIGS. 5A, 6A, and 7A is the number of particles on the processed wafer after the deposition process for each wafer number.

In Reference Example 1, after the cleaning process (step S5) of FIG. 3, the precoat process (step S7) was performed without the purge process (step S6), and a process of supplying a high pressure and large flow of $N_2$ gas was performed instead of the post-precoat process (step S8).

As indicated with a line A of FIG. 5A and in FIG. 5B, in Reference Example 1, the maximum number of particles was 5,399, the median was 369, and the number of particles was large. Because the gas flow rate was high in the large-flow process, particles due to TiN film peeling were generated frequently in the first approximately 10 substrates processed immediately after the precoating.

In Reference Example 2, after the cleaning process (step S5), $N_2$ purge was performed instead of the $NH_3$ purge process (step S6) of the present embodiment. In the purge process, a large flow of $N_2$ gas of approximately 1,000 sccm was supplied for five seconds, and a small flow of $N_2$ gas of approximately 300 sccm was supplied for five seconds alternately. A process of supplying a high pressure (450 Torr (60,000 Pa)) and a large flow of $N_2$ gas was performed for 48 hours instead of the post-precoat process (step S8).

As indicated with a line B of FIG. 5A and in FIG. 5B, in Reference Example 2, the maximum number of particles was 272 and the median was 140. That is, particles were decreased by removing the residual adsorbed $ClF_3$ by the $N_2$ purge. However, in Reference Example 2, the post-precoat process required 48 hours, and the productivity deteriorated.

In Reference Example 3, after the cleaning process (Step S5), N2 purge was performed for 38 hours instead of the purge process (Step S6). In addition, no process was performed to substitute for the post-precoat process (Step S8).

As indicated with a line C of FIG. 5A and in FIG. 5B, in Reference Example 3, the maximum number of particles was 198 and the median was 90. That is, particles were decreased by removing the residual adsorbed $ClF_3$. However, in Reference Example 3, the purge process required 38 hours, and the productivity deteriorated.

In Reference Examples 2 and 3, the maximum number of particles was decreased to 300 or less. However, the productivity decreased significantly.

Next, Reference Examples 4 and 5 of FIGS. 6A and 6B will be described. Reference Example 1 of FIGS. 6A and 6B was under the same condition as Reference Example 1 of FIGS. 5A and 5B, and the same results are presented. In Reference Example 4, the same process as Reference Example 2 was performed, and a process of supplying a high pressure (450 Torr (60,000 Pa)) and a large flow of $N_2$ gas was performed for four hours instead of the post-precoat process (step S8). In Reference Example 5, the same process as Reference Example 3 was performed, and $N_2$ purge was performed for three hours instead of the purge process (step S6).

As indicated with lines D and E of FIG. 6A, and in FIG. 6B, in Reference Example 4, the maximum number of particles was 9,383 and the median was 372, and in Reference Example 5, the maximum number of particles was 1,471 and the median was 162. When the purging time of the $N_2$ gas was shortened to improve productivity, the maximum number of particles was 1,000 or more, and the number of particles could not be decreased.

Next, the first embodiment and the second embodiment of FIGS. 7A and 7B will be described. Reference Examples 1 and 5 of FIGS. 7A and 7B were under the same conditions as Reference Example 1 of FIGS. 5A and 5B and as Reference Example 5 of FIGS. 6A and 6B, and the same results are presented.

In the first embodiment, after the cleaning process (step S5) of FIG. 3, the purge process (step S6) was performed, and in the purge process (step S6), constant $NH_3$ gas was supplied at a large flow of 9,000 sccm for three hours. Next, the precoat process (step S7) was performed, and a large-flow process of supplying a high-pressure $N_2$ gas was performed instead of the post-precoat process (step S8).

As indicated with a line F of FIG. 7A and in FIG. 7B, in the first embodiment, the maximum number of particles was 424 and the median was 85. From the results, it was found that the residual $ClF_3$ was removed by purging $NH_3$ gas for approximately three hours after the cleaning process, and as a result, the formation of $TiF_x$ layer was suppressed in the early stage of precoating, and the adhesion of the precoat film was improved. As a result, the generation of particles due to the film peeling of the precoat film was decreased.

In the second embodiment, as in the first embodiment, in the purge process (step S6), constant $NH_3$ gas was supplied at a large flow of 9,000 sccm for three hours. Next, a precoat process (step S7) was performed, and a process of supplying a high pressure and a large flow of $NH_3$ gas was performed in the post-precoat process (step S8). In the post-precoat process (step S8), no gas other than $NH_3$ gas and $N_2$ gas from the first continuous $N_2$ gas supply line L3 and the second continuous $N_2$ gas supply line L4 was supplied.

As indicated with a line G of FIG. 7A and in FIG. 7B, in the second embodiment, the maximum number of particles was 102 and the median was 57. From the results, it was found that the number of particles can be decreased to a maximum of approximately 100 by removing the residual adsorbed $ClF_3$ by the purge process of the $NH_3$ gas (step S6) and purging the high pressure and large flow of $NH_3$ gas in the post-precoat process (step S8).

When $ClF_3$ remains on the surface of the parts in the processing chamber 1 in the cleaning process, a $TiF_x$ layer is formed on the surface at the early stage of forming the precoat film, and it becomes a cause of particle generation by the film peeling of the precoat film. In the first embodiment and the second embodiment, by performing the purge process using the $NH_3$ gas after the cleaning process, most of the residual adsorbed $ClF_3$ on the surface of the parts was removed, and the particles after the formation of the precoat film were decreased.

Further, after the precoat process, in Reference Example 5, the weak film part in the precoat film was detached and removed by the purge of the high pressure and large flow of $N_2$ gas. In contrast, in the second embodiment, the purge of the high pressure and large flow of $NH_3$ gas was performed. As a result, the TiN film of the precoat film was modified with the $NH_3$ gas to make the TiN film of the precoat film stronger while the weak film part in the precoat film was detached and removed. Accordingly, particles were further decreased. As a result, particles after the formation of the precoat film were decreased without compromising productivity.

[Experimental Result 2]

Figure 8A:
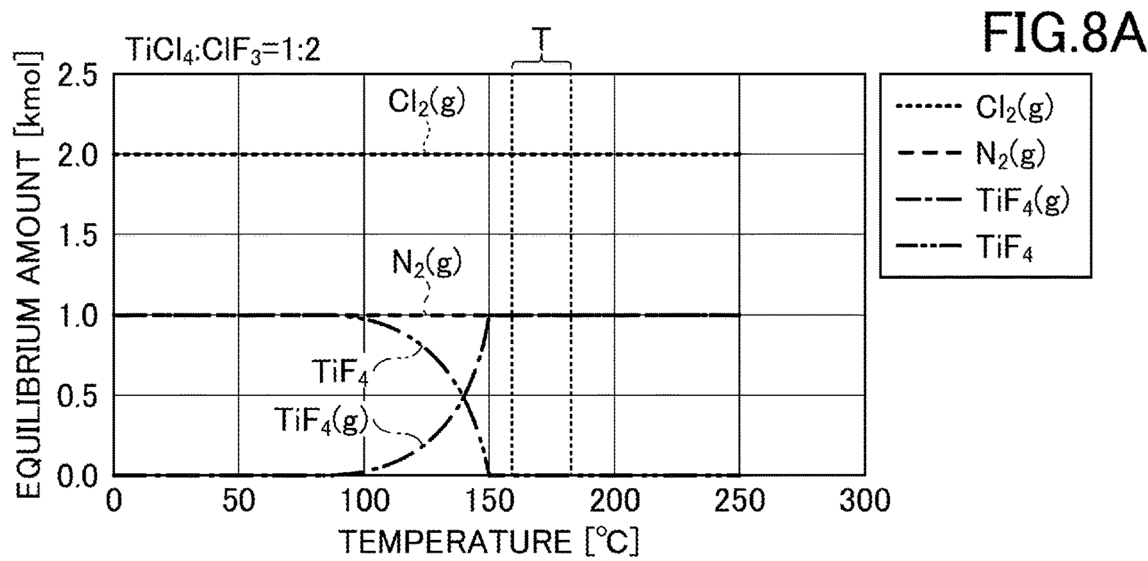
FIGS. 8A, 8B, and 8C are an example of a graph illustrating the relationship between the temperature in the processing chamber and the mole number of surface material after the precoat process.
Figure 8B:
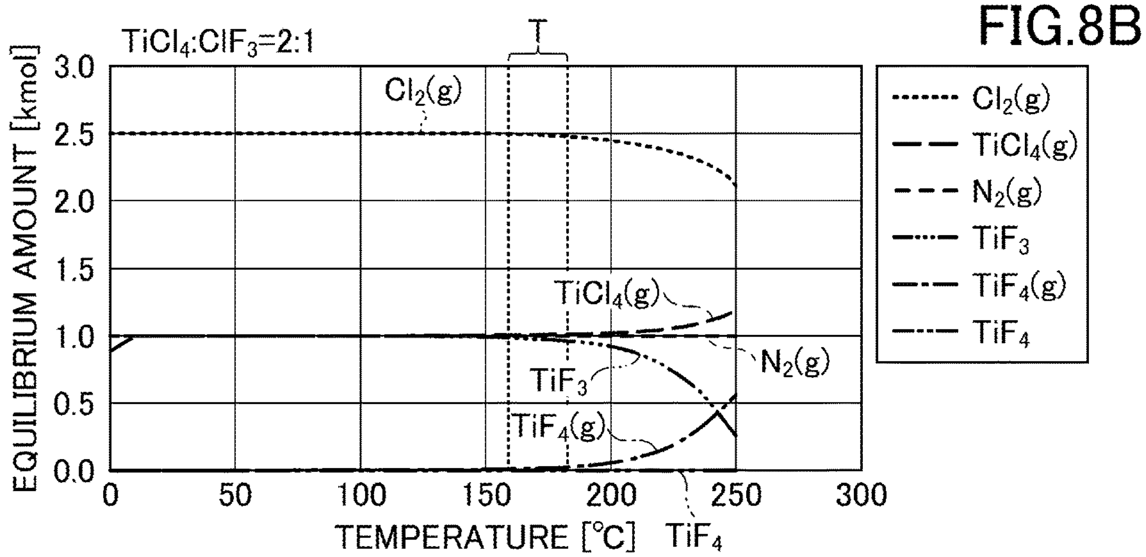
Figure 8C:
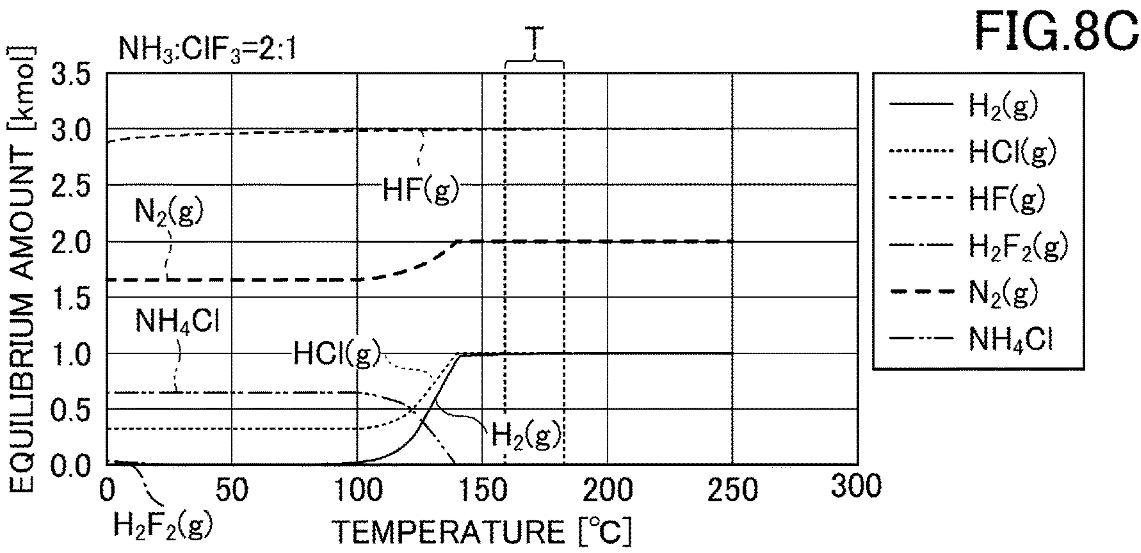

Next, with reference to FIGS. 8A to 8C, the relationship between the temperature in the processing chamber 1 and the mole number of material on the surface of the part by equilibrium composition calculation using thermodynamic calculation software will be described. FIGS. 8A to 8C are an example of a graph illustrating the relationship between the temperature in the processing chamber and the mole number of material on the surface after the precoat process and the purge process using the $NH_3$ gas.

In FIGS. 8A to 8C, the horizontal axis indicates the temperature in the processing chamber 1, and the vertical axis indicates the mole number of material (kmol) on the surface of the part. The temperature in the frame T in FIGS. 8A to 8C is the temperature in the processing chamber 1 after the precoat process and after the purge process using the $NH_3$ gas. Therefore, by observing the mole number at the temperature in the frame T, the surface condition of the part after the precoat process and after the purge process using the $NH_3$ gas can be determined.

As illustrated in FIG. 8C, when the flow rate ratio of $NH_3$ gas to $ClF_3$ gas is 2:1, in the surface state of the part after the purge process using the $NH_3$ gas, the mole number of HF (g) was large at the temperature of the frame T. In other words, in the purge process using the $NH_3$ gas after the cleaning process, the remaining $ClF_3$ was reacted with the $NH_3$ gas to form HF gas and vaporized. Accordingly, $TiCl_4$ gas can be supplied in the precoat process in a state where $ClF_3$ is decreased, and the adhesion of the precoat film can be enhanced in the precoat process.

When $TiCl_4$ gas is supplied in the precoat process to the surface of the part where a large amount of $ClF_3$ remains, $ClF_3$ reacts with the $TiCl_4$ gas to become $TiF_3$, which is difficult to volatilize, and adhesion occurs. In addition, as illustrated in FIG. 8B, when a flow rate ratio of $TiCl_4$ gas to $ClF_3$ gas is 2:1, as a result of the reaction of the $ClF_3$ on the surface of the part with the $TiCl_4$ gas, the mole number of $TiF_3$ is large on the surface of the part and the mole number of $TiF_4$ (g) is almost absent at the temperature in the frame T. Therefore, the $TiF_x$ produced does not volatilize as $TiF_4$ (g), and the TiN film of the precoat film is deposited in a state where the $TiF_x$ layer at the part interface remains. Then, in the post-precoat process after the precoat process, the TiN film of the precoat film is peeled off when a high pressure and a large flow of $NH_3$ gas is supplied, which causes particle generation.

In contrast, as illustrated in FIG. 8A, when the flow rate ratio of the $TiCl_4$ gas to the $ClF_3$ gas is 1:2, as a result of the reaction of the $ClF_3$ on the surface of the part with the $TiCl_4$ gas, the mole number of $TiF_4$ (g) is large on the surface of the part and the mole number of $TiF_3$ is absent at the temperature in the frame T. Therefore, the $TiF_x$ produced volatilizes as $TiF_4$ (g), and the TiN film of the precoat film is deposited on the $TiF_x$ layer in a state where the $TiF_x$ layer at the interface of the part is small. Then, in the post-precoat process after the precoat process, the TiN film of the precoat film is difficult to be peeled off when a high pressure and a large flow of $NH_3$ gas is supplied, and thus, particles can be decreased.

Therefore, when the flow rate of the fluorine-containing gas ($ClF_3$) supplied in the cleaning process is higher than the flow rate of the raw material gas ($TiCl_4$) supplied in the precoat process, the controller 7 may control to execute the precoat process. When the flow rate of the fluorine-containing gas supplied in the cleaning process is equal to or lower than the flow rate of the raw material gas, the controller 7 may control to stop the execution of the precoat process.

[Experimental Result 3]

Figure 9:
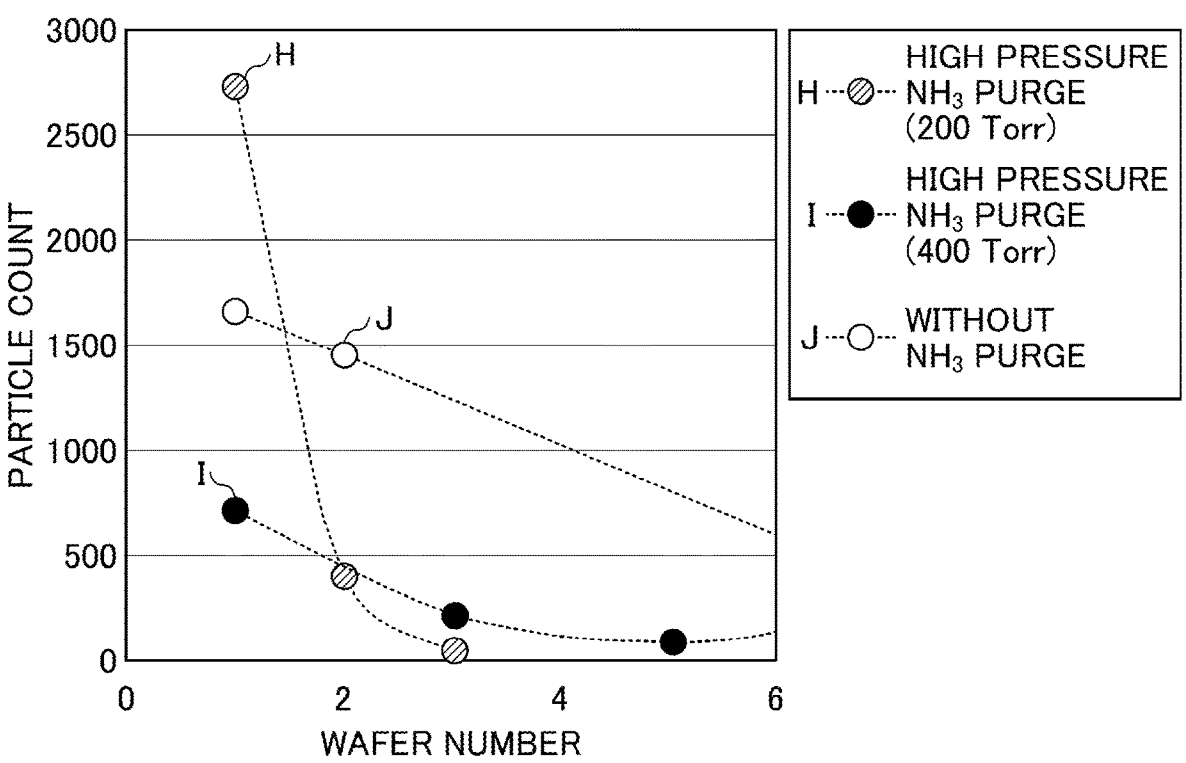
FIG. 9 is an example of a graph illustrating the relationship between the pressure of $NH_3$ gas and the number of particles in the post-precoat process.

Next, the relationship between the pressure of $NH_3$ gas and the number of particles in the post-precoat process will be described with reference to FIG. 9. FIG. 9 is an example of a graph illustrating the relationship between the pressure of $NH_3$ gas and the number of particles in the post-precoat process according to an embodiment.

In the second embodiment illustrated in FIGS. 7A and 7B, a high pressure and a large flow of $NH_3$ gas was supplied in the post-precoat process. In FIG. 9, the pressure of $NH_3$ gas in the post-precoat process was controlled variably. The horizontal axis of the graph in FIG. 9 is the number of the substrate (wafer), and the vertical axis is the number of particles.

A line H in FIG. 9, which is an example of the second embodiment, indicates the number of particles when the pressure of the $NH_3$ gas to be supplied is controlled at 200 Torr (26,665 Pa) in the post-precoat process. A line I in FIG. 9, which is an example of the second embodiment, indicates the number of particles when the pressure of the $NH_3$ gas to be supplied is controlled at 400 Torr (53,329 Pa) in the post-precoat process. Other conditions in the post-precoat process in the second embodiment are as described above, and the time to temporarily store the $NH_3$ gas in the buffer tank T2 was approximately 0.7 seconds, and the time to supply the $NH_3$ gas stored in the buffer tank T2 into the processing chamber 1 was approximately 0.3 seconds. In the post-precoat process, a large flow of 9,000 sccm of the $NH_3$ gas was supplied into the processing chamber 1 in approximately 20 minutes by repeatedly supplying and stopping the $NH_3$ gas 1,200 times.

A line J in FIG. 9 is a reference example in which high-pressure purging of $N_2$ gas was performed instead of the purging of the $NH_3$ gas in the post-precoat process. Conditions other than the gas in the post-precoat process are the same as those in the second embodiment.

As illustrated by lines H and I in FIG. 9, particles can be reduced when the pressure of $NH_3$ gas in the post-precoat process of the second embodiment was 400 Torr, rather than 200 Torr. When compared with line J in FIG. 9, the high-pressure purge of $NH_3$ gas in the post-precoat process can reduce particles more than the high-pressure purge of $N_2$ gas.

From the above, particles can be decreased by controlling the pressure in the processing chamber 1 to a range of 200 Torr (26,665 Pa) to 400 Torr (53,329 Pa) when $NH_3$ gas is supplied in the post-precoat process.

As described above, according to the precoat method of the substrate processing apparatus and the substrate processing apparatus according to the present embodiment, particles can be decreased without reducing productivity.

The precoat method for the substrate processing apparatus and the substrate processing apparatus according to the present disclosed embodiment should be considered exemplary in all respects and not restrictive. The embodiments can be modified and improved in various forms without departing from the scope and subject matter of the appended claims. The matters described in the above embodiments may be incorporated into other configurations to the extent that they are consistent, and may be combined to the extent that they are consistent.

According to the present disclosure, a precoat method for a substrate processing apparatus and a substrate processing apparatus that can reduce particles without reducing productivity are provided.

What is claimed is:

1. A precoat method for a substrate processing apparatus for depositing on a substrate using a raw material gas and a reducing gas, the method comprising:

a) supplying a fluorine-containing gas into a processing chamber to clean an inside of the processing chamber;

b) after a), supplying a reducing gas into the processing chamber to purge the inside of the processing chamber;

c) after b), supplying a raw material gas and a reducing gas into the processing chamber to form a precoat film; and d) after c), supplying a reducing gas into the processing chamber to purge the inside of the processing chamber before depositing on a subsequent substrate, wherein the reducing gas supplied in b) is $NH_3$ gas, the reducing gas supplied in d) is $NH_3$ gas, in d), the $NH_3$ gas is supplied from a buffer tank after being temporarily stored in the buffer tank to control a pressure in the processing chamber to approximately 400 Torr, such that a part of the precoat film containing Cl is physically removed by the $NH_3$ gas based on the controlled pressure, and in b), the $NH_3$ gas is not stored in a buffer tank before being supplied.

2. The precoat method according to claim 1, wherein in b), a constant flow of the $NH_3$ gas is supplied.

3. The precoat method according to claim 2, wherein in b), the constant flow of the $NH_3$ gas is supplied for three hours or more to purge.

4. The precoat method according to claim 1, wherein the reducing gas supplied in b) is same as the reducing gas used in the depositing on the substrate.

5. The precoat method according to claim 1, wherein the raw material gas and the reducing gas supplied in c) are same as the raw material gas and the reducing gas, respectively, used in the depositing on the substrate.

* * * * *